US006664871B2

(12) United States Patent  (10) Patent No.: US 6,664,871 B2
Yip  (45) Date of Patent: Dec. 16, 2003

(54) CASCADED SURFACE ACOUSTIC WAVE FILTER SYSTEM FOR CANCELLING TIME SPURIOUS RESPONSES

(75) Inventor: David S. Yip, La Mirada, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/150,264

(22) Filed: May 16, 2002

(65) Prior Publication Data

US 2003/0214371 A1 Nov. 20, 2003

(51) Int. Cl.[7] .................................................. H03H 9/00
(52) U.S. Cl. ....................... 333/194; 333/193; 333/195; 333/196; 333/133; 333/30; 333/25; 333/26; 310/313 R; 310/313 C; 310/313 B; 310/313 D
(58) Field of Search ............................. 333/25, 26, 27, 333/30, 71, 72, 193, 194, 195, 196, 133

(56) References Cited

U.S. PATENT DOCUMENTS

| | | | | |
|---|---|---|---|---|
| 3,659,231 A | * | 4/1972 | De Vries | 333/194 |
| 4,063,202 A | * | 12/1977 | Vasile | 333/194 |
| 4,126,838 A | * | 11/1978 | McCusker et al. | 333/194 |
| 5,073,763 A | | 12/1991 | Wright | |
| 5,892,418 A | * | 4/1999 | Onishi et al. | 333/193 |
| 6,104,260 A | * | 8/2000 | Yamada et al. | 333/193 |
| 6,559,738 B2 | * | 5/2003 | Tsuruoka et al. | 333/193 |

OTHER PUBLICATIONS

T. Kodama, H. Kawabata, Y. Yasuhara and H. Sato, "Design of Low–loss Saw Filters Employing Distributed Acoustic Reflection Transducers," *IEEE Ultrason. Symp. Proc.*, pp. 59–64, 1986.

B.P. Abbott, C.S. Hartmann and D.C. Malocha, "Matching of Single–Phase Unidirectional SAW Transducers and a Demonstration Using a Low–Loss EWC/SPUDT Filter," *IEEE Ultrasonics Symposium*, pp. 49–53, 1990.

P.V. Wright, D.F. Thompson and R.E. Chang, "Single–Phase Unidirectional Transducers Employing Uniform–Width Dithered Electrodes," *IEEE Ultrason. Symp. Proc.*, pp. 27–32, 1995.

* cited by examiner

*Primary Examiner*—Michael Tokar
*Assistant Examiner*—Linh Van Nguyen
(74) *Attorney, Agent, or Firm*—Posz & Bethards, PLC

(57) ABSTRACT

A cascaded SAW filter system includes first and second SAW filters (12a, 12b) each including an input transducer (36, 36') and an output transducer (37, 37') on a piezoelectric substrate (38, 38'). Group delay and pass band ripples associated with a time spur at TD' away from the main signal of the second filter (12b) cancel the group delay and pass band ripples associated with a time spur at TD away from the main signal of the first filter (12a) because: 1) the input and output transducers (36', 37') of the second filter (12a) are offset from those of the first filter (12a); 2) the center frequency ($f_0'$) of the second filter (12b) is offset from the center frequency ($f_0$) of the first filter (12a); 3) the perturbation region (P1) of the first filter (12a) is different from the perturbation region (P2) of the second filter (12b) or 3) a combination of 1), 2) and/or 3. The associated time spur echo of the cascaded response will also be canceled. Also, time spurs due to reflections from the ends of the input and output transducers of the first and second filters (12a, 12b) can be cancelled by adding dummy fingers (36a, 37a) at each end of the input arid output transducers of the second filter.

27 Claims, 10 Drawing Sheets

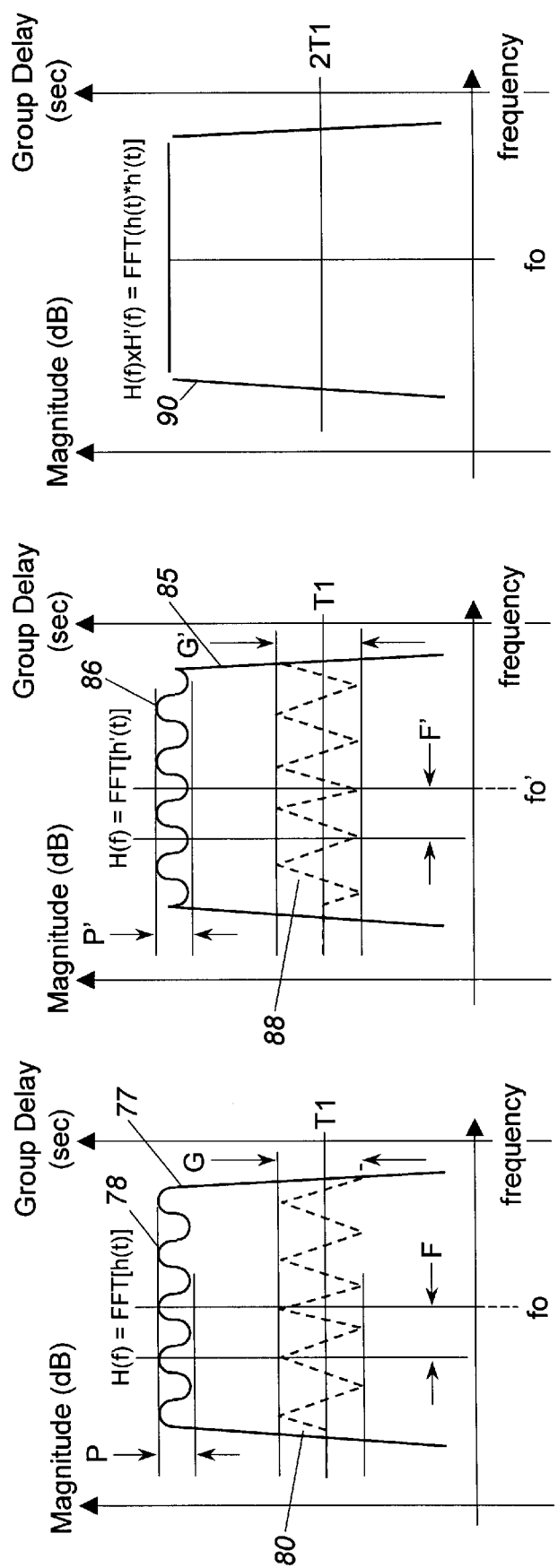

CASCADED SURFACE ACOUSTIC WAVE FILTER SYSTEM FOR CANCELLING TIME SPURIOUS RESPONSES

FIELD OF THE INVENTION

This invention relates generally to Surface Acoustic Wave (SAW) filters and, more particularly, to the elimination of undesirable time spurious signals such as electromagnetic feedthrough and acoustic echoes in SAW filters.

BACKGROUND

Triple transit echoes and electromagnetic feedthrough associated with SAW filters represent well-known problems in the design of communications systems. Triple transit echoes are produced when the acoustic wave generated by an input transducer is first reflected and regenerated by the output transducer, and then is again reflected and regenerated by the input transducer. Actually, such regenerations and reflections of the SAW back and forth between the input and output transducers result in fifth, seventh and higher order transit echoes in addition to triple transit echoes. The resulting echoes degrade filter performance by creating both group delay and pass band ripples.

Many successful techniques have been developed to reduce the effects of triple transit echoes in SAW filters. Specifically, single phase, two-phase, three-phase and four-phase unidirectional transducers are often used to reduce the effects of triple transit echoes. Single-phase unidirectional transducers (SPUDT) are commonly used because such filters are easily fabricated and require only simple matching circuits at the input transducer and output transducer, respectively. Distributed Acoustic Reflection Transducer (DART) SPUDT, Electrode Width Controlled (EWC) SPUDT, Group SPUDT (GSPUDT) and Dithered SPUDT (DSPUDT) are examples of different types of SPUDTs.

SPUDT SAW filters are widely used in mobile phone and satellite communications systems because of their superior channel selectivity and relatively low insertion loss. However, SPUDT filter performance depends heavily on the stability of the matching circuits. Therefore, decreases in triple transit suppression (TTS), and increases in group delay and pass band ripples due to matching component (resistor, inductor and capacitor) value variations and temperature-induced mismatch in the matching circuits adversely affects the performance of such filters. It can also be labor intensive to fine-tune the matching circuits in order to meet the requirements for the high performance SAW filters used in satellite communications.

Two identical or similar cascaded filters are commonly used in the above-mentioned systems. In order to overcome the above limitations, these filters are generally overdesigned in order to meet the cascaded requirements because the cascaded group delay and pass band ripples associated with the triple transit echo in general will double, and the cascaded TTS will degrade by 6 dB with respect to individual filter responses. In general, TTS worsens as the insertion loss of a SAW filter is reduced. As a result, the insertion loss of the SPUDT filter is purposely designed to be higher than the filter's capability in order to enhance TTS. However, this overdesign increases the overall cost of implementing the cascaded filters.

Electromagnetic (EM) feedthrough is the EM energy coupled directly from the input transducer to the output transducer and from the input matching circuit to the output matching circuit. Since the EM waves travel near the speed of light, the feedthrough usually shows up as a time spur near time=0 seconds. The feedthrough is an undesired signal that degrades filter performance by creating both group, delay and pass band ripples in the pass band, and that reduces the ultimate rejection outside the pass band regions in the frequency domain. The problem becomes very prominent for high frequency SAW filters since the input and output transducers and the input and output matching circuits are placed much closer to each other since the filter geometry is inversely proportional to the operating frequency.

There are many methods for reducing feedthrough. Some examples are 1) carefully designing the filter packages to electrically isolate the input transducer and input matching circuit from that of the output side; 2) using balanced transformers in input and output matching circuits; 3) strategically grounding the transducers to the package; and 4) Inserting a metallic ground bar between the input and output transducers. Methods 3) and 4) are simple to implement; however, the feedthrough cannot be fully suppressed, especially when the operating frequency is high. Methods 1) and 2) are more effective methods for reducing feedthrough; however, these methods increase the overall cost of the filter package and the complexity of the matching circuits. When two such filters are cascaded, the cascaded feedthrough level will be 6 dB worse than the feedthrough suppression of each individual filter. This degradation in feedthrough suppression becomes problematic in the above-discussed satellite and mobile phone applications in which feedthrough suppression is crucial.

In addition, reflections from the edges of the transducers in a SPUDT SAW filter will cause undesirable time spurs in the time domain response, especially for filters built on very strong coupling material like lithium niobate. When two such filters are cascaded, spur suppression will be 6 dB worse than the spur suppression of each individual filter. This degradation in spur suppression becomes problematic in the above-discussed satellite and mobile phone applications in which spur suppression is crucial.

Therefore, it is an object of the present invention to provide a surface acoustic wave filter system that eliminates group delay and pass band ripples associated with the time spur while at the same time is capable of maintaining time spur suppression without the need for costly system over-design.

It is a further object of the present invention to provide a surface acoustic wave filter system in which the transducers of a first filter are offset from the transducers of a second filter by a predetermined amount with respect to either the time or frequency domain to eliminate group delay and pass band ripples.

It is another object of the present invention to provide a surface acoustic wave filter system in which a perturbation region located between the input and output transducers of a first filter is physically different from a perturbation region located between the input and output transducers of a second filter by a predetermined amount to eliminate group delay and pass band ripples.

It is a further object of the present invention to provide a surface acoustic wave filter system in which the transducers of a first filter are offset from the transducers of a second filter by a predetermined amount with respect to either the time or frequency domain, and in which a perturbation region located between the input and output transducers of a first filter is physically different from a perturbation region located between the input and output transducers of a second filter by a predetermined amount, to eliminate group delay and pass band ripples.

In addition, it is an object of the present invention to provide a cascaded surface acoustic wave filter that eliminates undesirable time spurs in the time domain response caused by reflections from transducer edges.

SUMMARY OF THE INVENTION

In view of the above, the present invention provides a cascaded SAW filter system in which two SAW filters are electrically cascaded in series to cancel time spurious signals. The first filter consists of one input transducer and one output transducer built on a piezoelectric substrate. A perturbation region may or may be not present between the two transducers of the first filter. The $m^{th}$ transit echo (where m is an odd number greater than 1) or feedthrough associated with the first filter is at a time TD (TD will be negative for the case of feedthrough) away from the main response in the time domain and has an associated frequency response with, a center frequency fo. The second filter consists of one input transducer and one output transducer built on a piezoelectric substrate that can be the same, or different, type of material as that of the first filter, and that can be fabricated either on the same substrate as that of the first filter or on a separate substrate. A perturbation region may or may be not present between the two transducers of the second filter. The $m^{th}$ transit echo or feedthrough associated with the second filter is at a time TD' (TD' will be negative for the case of feedthrough) away from the main response in the time domain, and has an associated frequency response with a center frequency fo' that is similar to, but typically slightly offset from, the center frequency fo of the first filter.

In the cascaded SAW filter system of the present invention, the group delay and pass band ripples associated with the time spur of the second filter cancel the group delay and pass band ripples associated with the similar time spur of the first filter because 1) the input transducer of the second filter is offset from that of the first filter; 2) the center frequency of the second filter is offset from that of the first filter; 3) the perturbation region of the first filter is different from the perturbation region of the second filter or 4) a combination of 1), 2) and 3) so that the group delay and pass band ripples between the two filters are 180° out of phase and TD-TD'=(n+½)/fo, where n is an integer greater than or equal to zero. The associated time spur of the cascaded response will also be canceled. In particular, if the input transducer and the output transducer of the first filter are equal to those of the second filter, the cascaded $m^{th}$ transit echo or feedthrough can be cancelled by either offsetting the input and output transducers of the second filter by $\lambda(n+½)/(m-1)$ where $\lambda=v/fo$ and v=the propagation velocity of the surface acoustic wave, m=2 for feedthrough and m is odd and greater than 1 for the $m^{th}$ transit echo, or by offsetting the center frequency fo' of the second filter by (n+½)/TD from the center frequency fo of the first filter.

A similar technique can be used to cancel the reflections at the ends of the transducers by adding extra dummy fingers at the ends of the transducers of the second filter so that the edges of the transducers of the second filter are approximately (n+½) $\lambda/2$ from the respective edges of the transducers of the first filter.

BRIEF DESCRIPTION OF THE DRAWINGS

Additional objects and advantages of the present invention will be more readily apparent from the following detailed description of preferred embodiments thereof when taken together with the accompanying drawings in which:

FIGS. 6, 7 and 8A–8C graphically illustrate the effects of the cascaded SAW filter system according to the present invention in the time and frequency domain;

DESCRIPTION OF THE PREFERRED EMBODIMENTS

Figure 1:
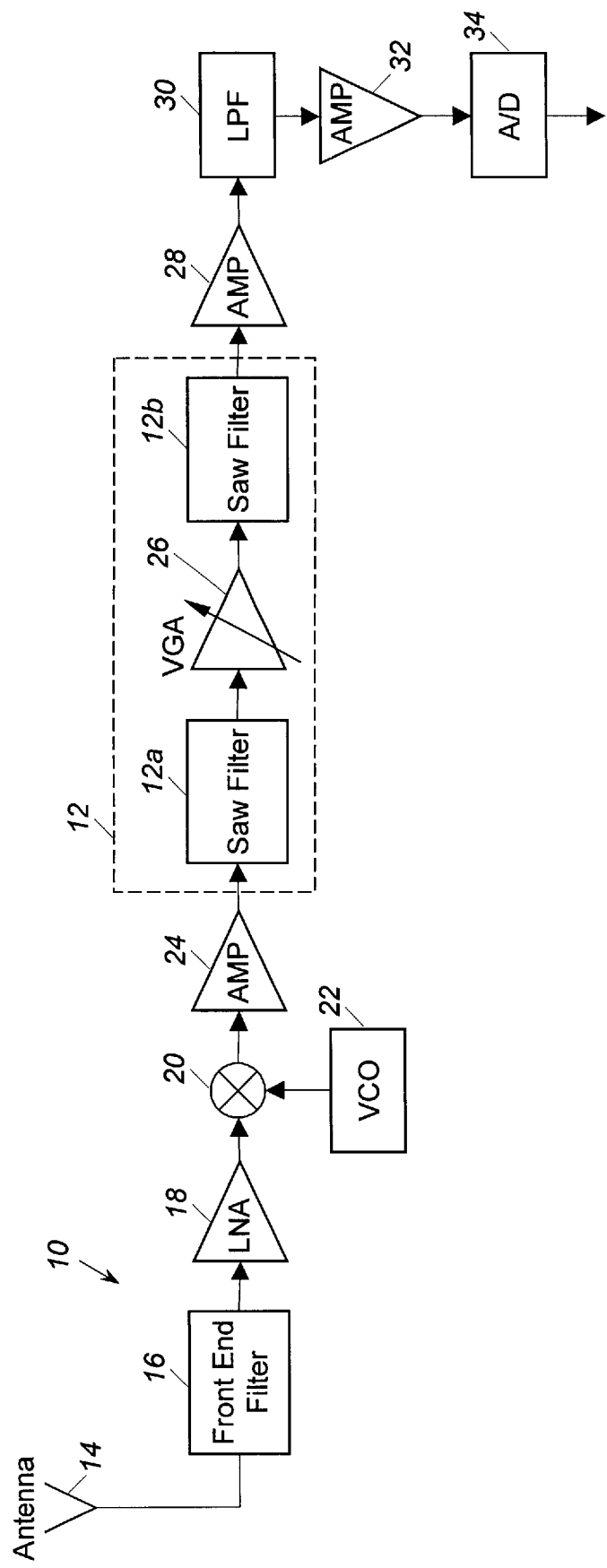
FIG. 1 is a block diagram of an exemplary satellite communications system in which the cascaded SAW filter system according to a preferred embodiment of the present invention may be implemented.

Referring now to the drawings in which like numerals reference like parts, FIG. 1 shows an exemplary satellite communications system 10 in which a cascaded surface acoustic wave filter system (SAW filter system) 12 including SAW filters 12a, 12b, according to a preferred embodiment of the present invention is implemented. The satellite communications system 10, which may be any satellite deployed for commercial or military communications purposes, includes an antenna 14 for receiving and transmitting a signal in a predetermined operating frequency such as an RF signal. A high frequency front-end filter 16 filters unwanted signal portions including transients and noise from the signal prior to the signal being amplified by a low noise amplifier (LNA) 18. The amplified signal output from the LNA 18 is then mixed at a mixer 20 with a single tone-oscillating signal generated by an oscillator (VCO) 22. The resulting signal output from the mixer 20 is an IF signal that is input into an amplifier 24. The amplifier 24 amplifies the IF signal to a required input level of the SAW filter 12a. The SAW filter 12a then filters the signal in a manner that will be discussed below.

A SAW filter system buffer, such as a variable gain amplifier (VGA) 26, prevents distortion of the IF signal as the IF signal is output from the SAW filter 12a and input into the SAW filter 12b. In other environments, this buffer may be a component other than the VGA 26. Regardless, some type of buffer between the SAW filters 12a, 12b is desirable in order to electrically isolate the SAW filters 12a, 12b from one another and thereby prevent signal distortion. In addition, the VGA 26 adjusts the signal level of the IF signal to an input level of the SAW filter 12b. An amplifier 28 amplifies the IF signal output from the SAW filter 12b, and a lowpass filter 30 filters out high frequency noise that the SAW filters 12a, 12b are not capable of filtering from the IF signal. An amplifier 32 amplifies the IF signal to an input level of an A/D converter 34. The A/D converter 34 then converts the signal to a digital signal so that the signal can be further processed by other system components.

While the SAW filter system 12 will be discussed with reference to its implementation in the satellite communications system 10 throughout the present specification for purposes of illustration and discussion, the SAW filter system 12 may be implemented in any communications-related environment, such as, for example, a wireless communications base station, as well as any other environment in which surface acoustic waves are generated and transmitted, to cancel time spurs and therefore the associated pass band and group delay ripples.

Figure 2:
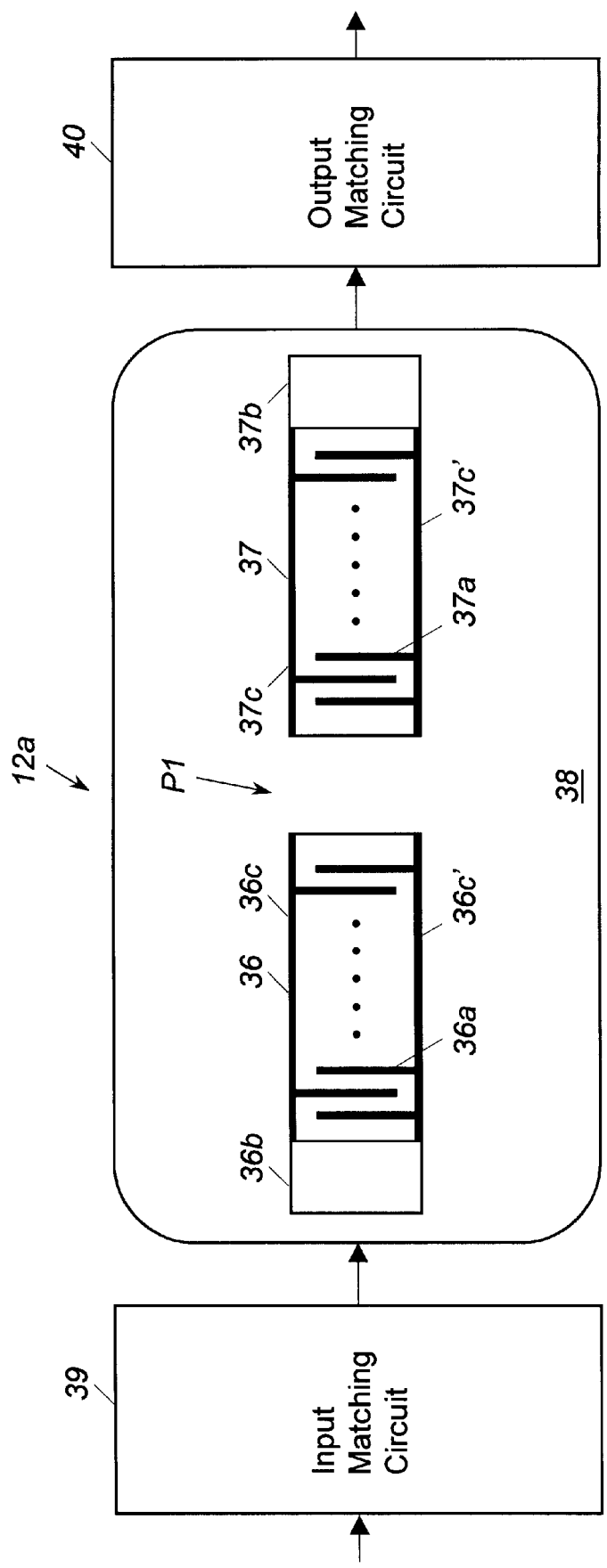
FIG. 2 is a more detailed block diagram of a SAW filter shown in FIG. 1.

FIG. 2 shows in more detail the structure of the SAW filter 12a, with it being understood that the structure of the SAW filter 12b is essentially the same as that of the SAW filter 12a, and that the filter topology shown is just one example of transducer topology and is used here only for purposes of illustration and discussion. As shown, the SAW filter 12a includes an input transducer 36 and an output transducer 37 mounted on a piezoelectric substrate 38 and positioned between input and output matching circuits 39, 40. A perturbation region P1 is positioned between the input transducer 36 and the output transducer 37. The input and output transducers 36, 37 are preferably formed from, for example, aluminum, aluminum alloy, gold, titanium, chromium or the like, and are spaced apart from one another on the substrate 38 according to the transmission characteristics of the surface acoustic wave to be transmitted therebetween. The input and output transducers 36, 37 include interdigital fingers (fingers) 36a, 37a. One group of the fingers 36a is electrically connected to a common bus bar or electrode 36c, and another group of the fingers 36a is electrically connected to a common bus bar or electrode 36c', for electrical conduction. Similarly, one group of the fingers 37a is electrically connected to a common bus bar or electrode 37c, while another group of the fingers 37a is electrically connected to a common bus bar or electrode 37c', for electrical conduction. However, one skilled in the art will appreciate that a two phase, three phase or four phase unidirectional transducer has more than two bus bars. Also, one or both of the input or output transducers 36, 37 may consist of more than one sub-transducer connected in series, or in parallel, or a combination of series and parallel, with each such sub-transducer having a configuration that is similar to the input and output transducers 36, 37. Acoustic absorbers 36b, 37b are usually placed near the respective ends of the input and output transducers 36, 37 for absorbing unwanted acoustic energy leaking toward the respective ends.

With reference now being made again to both SAW filters 12a, 12b, perturbation regions P1, P2 can be implemented in a number of ways as shown in FIGS. 3A–3G. In general, the SAW: propagation velocity vp in the perturbation region P1 of the SAW filter 12a is different from the free surface velocity v. The width Y of the perturbation region P1 should be greater than the height w of the input and output transducers 36, 37. Also, the transducer aperture and edge E1 is in general but not necessarily always parallel to the edge E2 at least over the transducer aperture, and the edges E1, E2 do not have to be parallel to the transducer fingers 36a. The same structural parameters also apply to the SAW filter 12b.

Figure 3A:
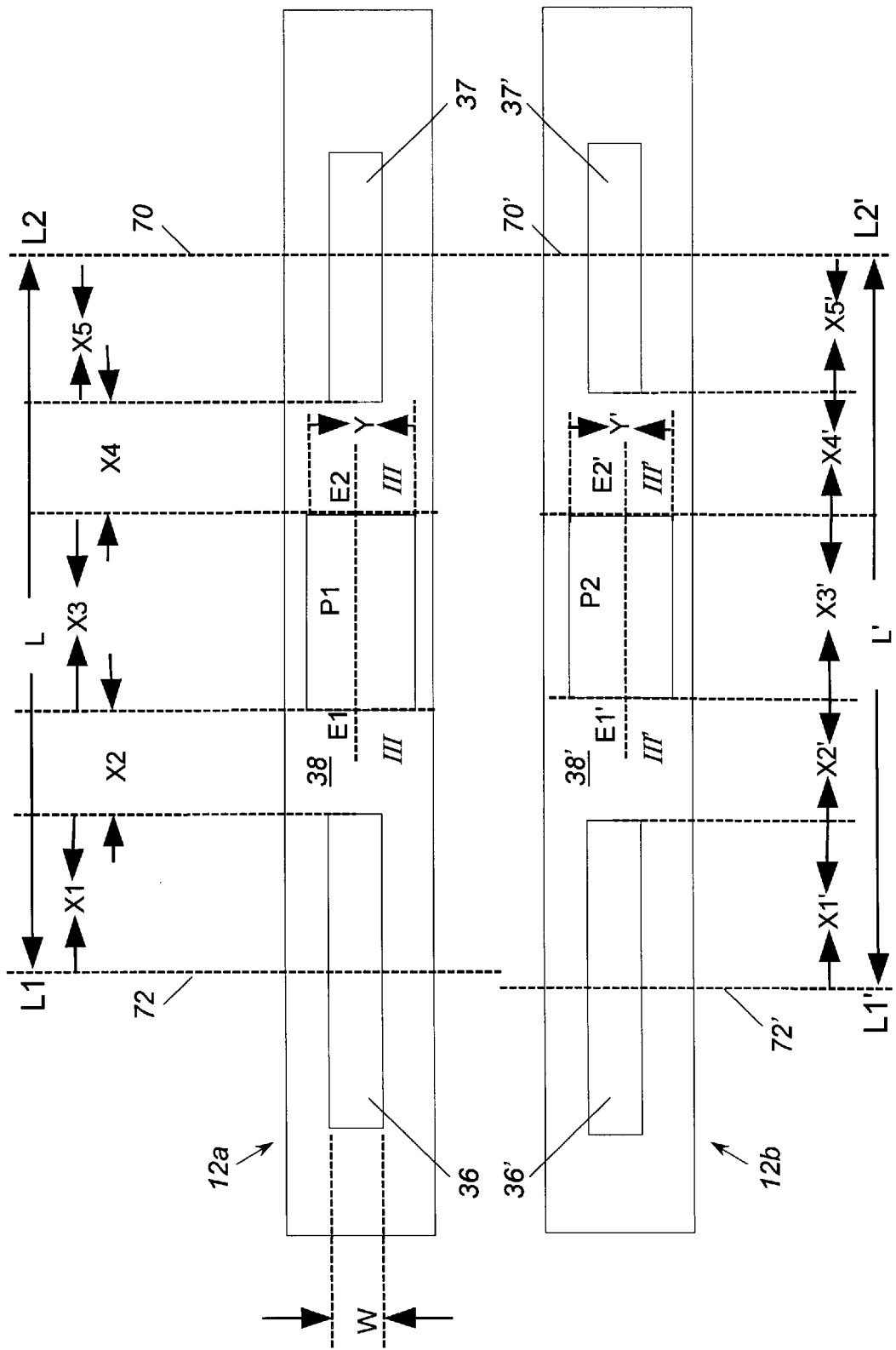
FIG. 3A is a detailed block diagram of the SAW filters shown in FIG. 1 that illustrates the dimensions of the SAW filters.
Figure 3C:
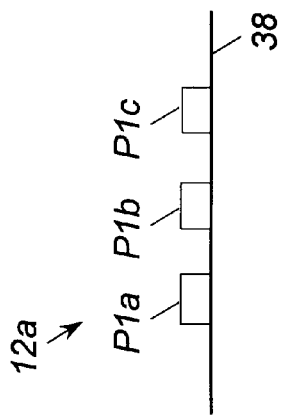
FIGS. 3B–3G are cross-sectional side elevation views of several exemplary configurations of the perturbation regions P1, P2 of the SAW filters shown in FIG. 3A.
Figure 3E:
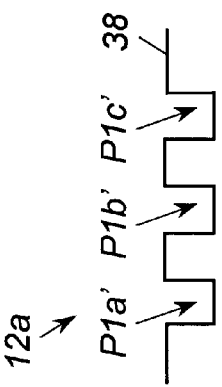
Figure 3G:
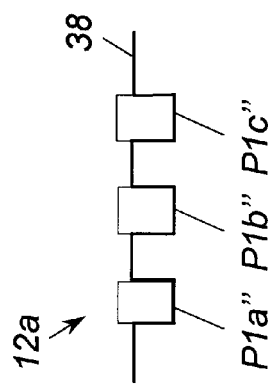
Figure 3B:
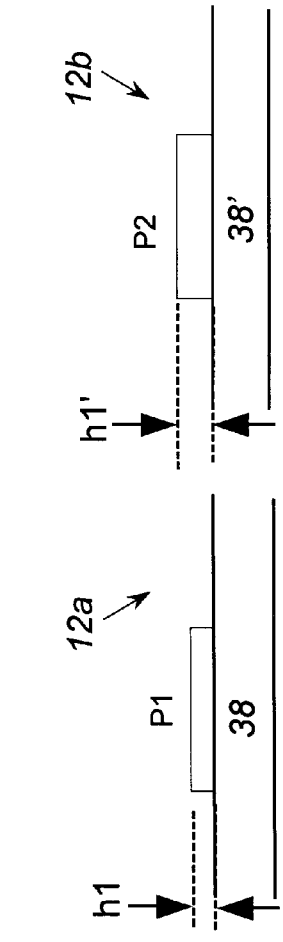

More specifically, as shown in FIG. 3B, the perturbation regions P1, P2 can be formed as metallized surfaces having respective thicknesses h1, h1' using the same, or different, material as that used to form the transducer fingers 36a, 37a. Therefore, if the thickness h1 of the perturbation region P1 is different from the thickness h1' of the perturbation region P2, $v_p$ will be different from $v_{p'}$. As shown in FIG. 3C, the perturbation region P1 and/or the perturbation region P2 can be sub-divided into more than ;one section as represented by the sections P1a, P1b, P1c.

Figure 3D:
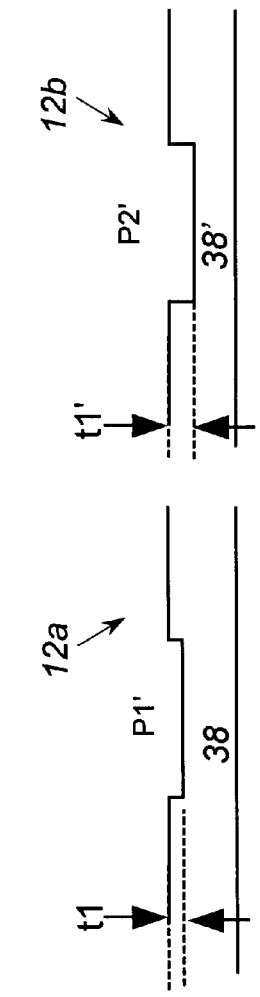

Alternatively, as shown in FIG. 3D, perturbation regions P1', P2' of SAW filters 12a', 12b' can be formed as recessed surfaces by etching the substrate surfaces 38, 38' to respective depths t1, t1'. Therefore, if the depth t1 of the perturbation region P1' is different from the depth t1' of the perturbation region P2', $v_p$ will be different from $v_{p'}$. As shown in FIG. 3E, the perturbation region P1' and/or the perturbation region P2' can be sub-divided into more than one section as represented by the sections P1a', P1b', P1c'.

Figure 3F:
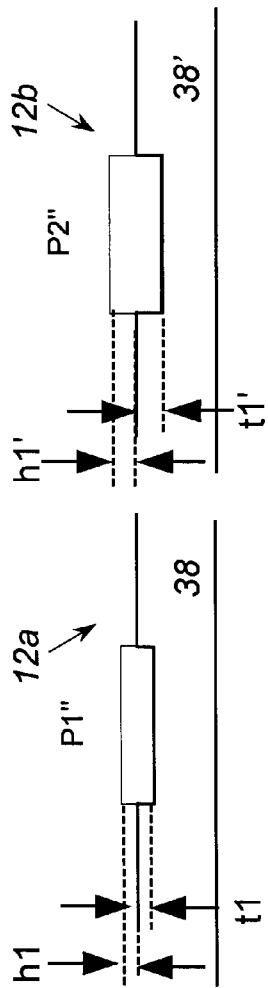

As shown in FIG. 3F, perturbation regions P1", P2" can be formed by depositing metal with respective thicknesses h1, h1' in recessed surfaces created by etching the substrate surfaces 38, 38' to respective depths t1, t1'. Therefore, if the depth t1 of the perturbation region P1 is different from the depth t1' of the perturbation region P2 and/or the thickness h1 is different from the thickness h1', $v_p$ will be different from $v_{p'}$. As shown in FIG. 3G, the perturbation region P1 and/or the perturbation region P2 can be sub-divided into more than one section as represented by the sections P1a", P1b", P1c".

Referring again to FIG. 2, the substrate 38 is a piezoelectric material such as quartz, lithium tantalate, lithium niobate or the like. The input and output matching circuits 39, 40 each include one or more RLC components to match the impedance of the SAW filter 12a to the impedance, or loading, of the rest of the satellite communications system 10 or other system in which the SAW filter 12a (as well as the SAW filter 12b) is implemented.

Still referring to FIG. 2, in operation, the input transducer 36 is for receiving an input AC signal, such as the IF signal discussed above, and for generating an electrical field in a gap defined between the input transducer fingers 36a due to excitation of the fingers 36a by the AC signal. The electrical field is then converted by the input transducer 36 into a mechanical perturbation, or SAW, that propagates across the substrate 38. Part of the SAW propagate away from the output transducer 37 and is absorbed by the acoustic absorber 36b. The rest of the SAW propagates to the output transducer 37 through the perturbation region P1. The output. transducer 37 receives the SAW and converts it back to an AC signal in a manner opposite that described in connection with the input transducer 36. As a result of the wave generation and transmission across the substrate 38, only certain frequencies of the signal input into the input transducer 36 are transmitted to the output transducer 37 depending upon the resonant structure of the input and output transducers 36, 37.

Figure 4:
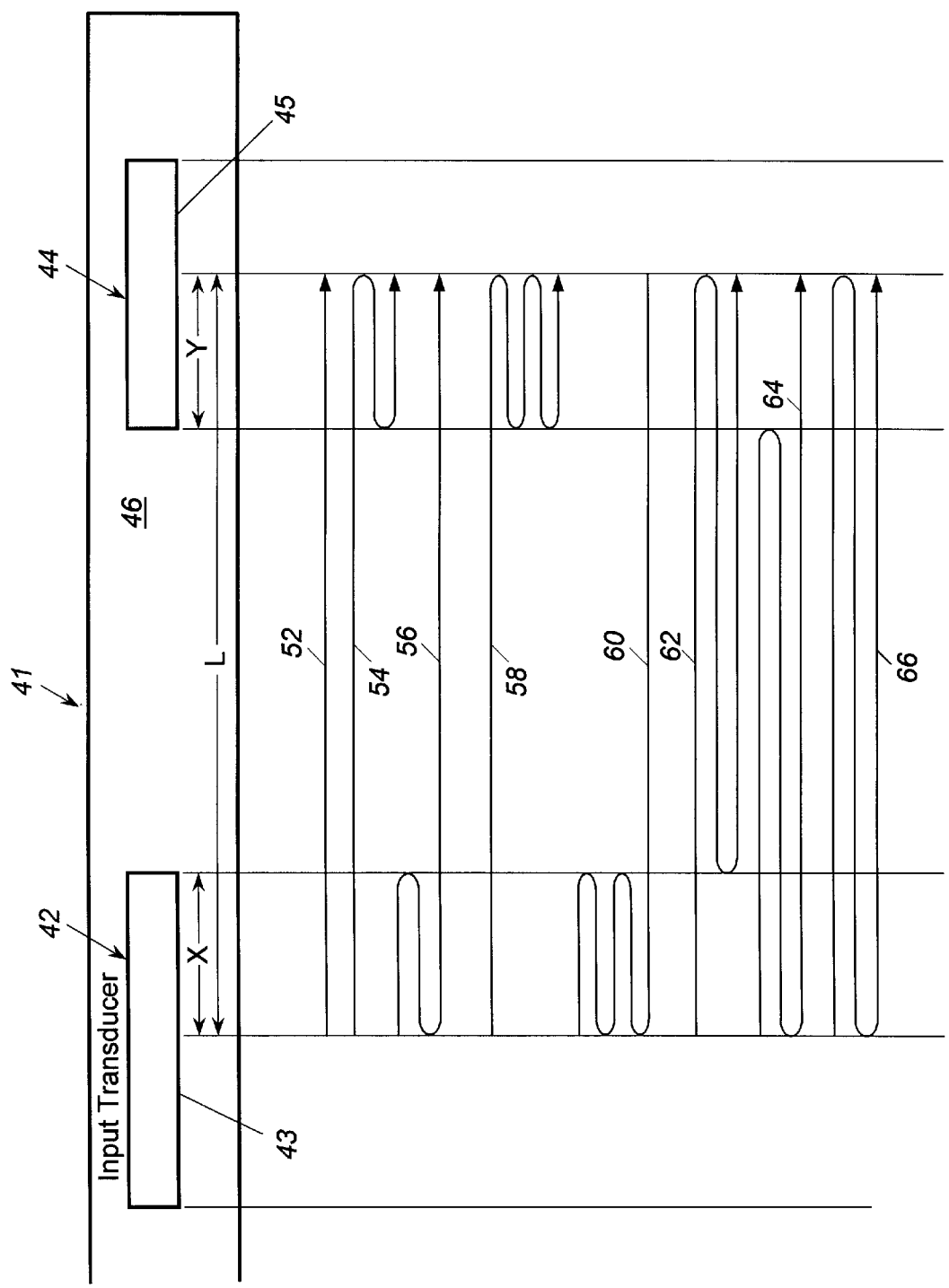
FIG. 4 is a plan view of an exemplary related art SAW filter and corresponding acoustic wave path diagram.
Figure 5:
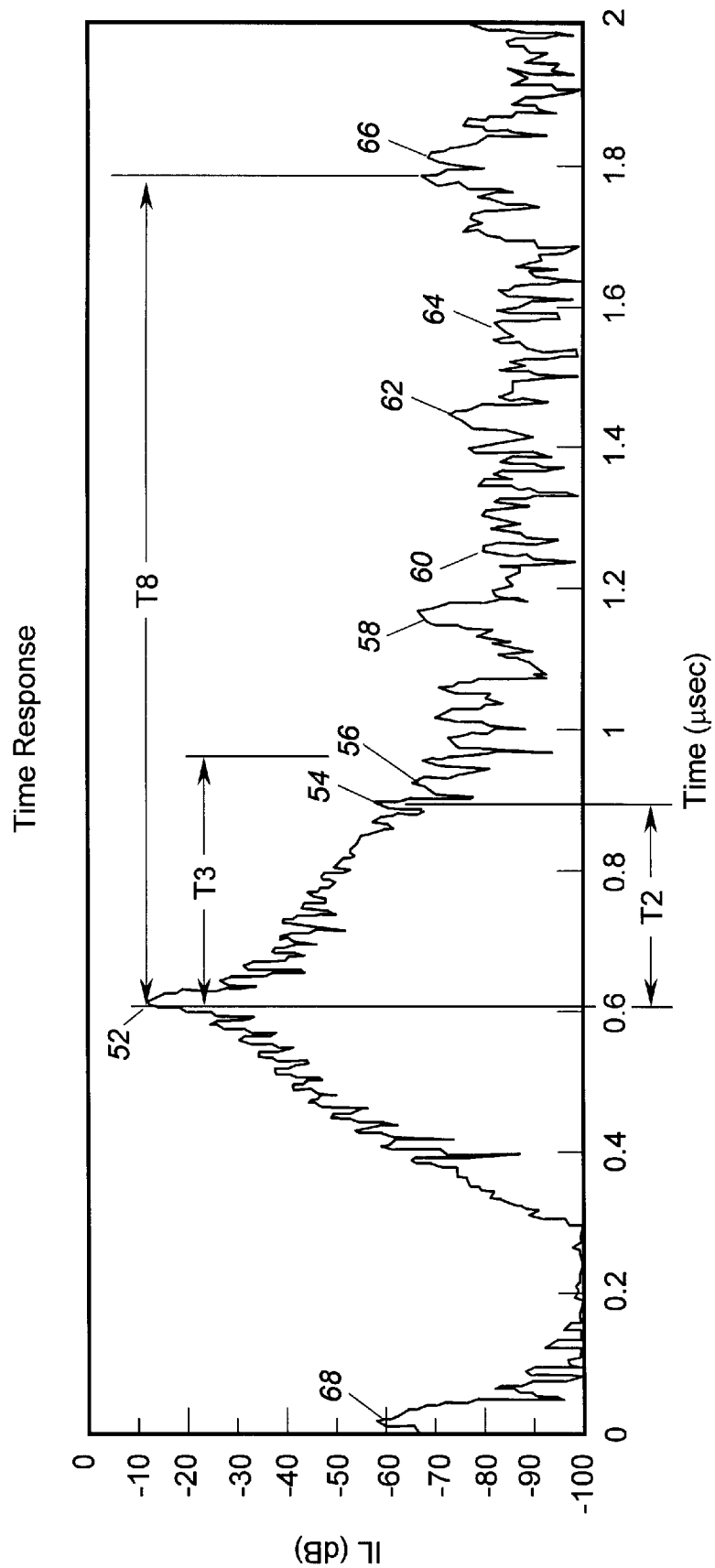
FIG. 5 is a graph of the time domain response of the SAW filter shown in FIG. 4.

Referring now to FIGS. 4 and 5, general operation of a conventional SAW filter 41 will briefly be discussed. The perturbation region P1 is excluded from the picture to simplify the explanation. As shown, the generation and subsequent propagation of the direct SAW 52 from an input transducer 42 with an acoustic absorber 43, with it being understood that the acoustic absorber 43 is usually but not necessarily always separated from the transducer 42. The SAW propagates to an output transducer 44 with an acoustic absorber 45 across a piezoelectric substrate 46. This propagation consequently results in the generation and propagation of spurious responses, or time spurs, such as regenerated waves 54, 56, second regenerated waves 58, 60, and regenerated waves 62, 64. As is known in the art, the regenerated waves 54, 56 are typically two of the more challenging spurs to eliminate and are very strong spurs if a SAW filter is built on a substrate formed from a strong coupling material such as lithium niobate. In addition, a triple transit echo is generated as indicated at 66 and feedthrough 68 near zero seconds in propagation time are universal for all SAW filters constructed in a manner similar to the SAW filter 41.

Referring again to FIG. 3A, the SAW filters 12a, 12b of the SAW filter system 12 according to a preferred embodiment of the present invention will be discussed in more detail. Although shown in a side-by-side configuration for purposes of discussion and illustration, it should be appreciated that the filters are in actuality cascaded and are therefore in series electrical communication with one another. More specifically, FIG. 3A shows the spacing of the input transducers 36, 36', output transducers 37, 37' and perturbation regions P1, P2 of SAW filters 12a, 12b relative to one another. As shown, the SAW filter 12b includes input and output transducers 36', 37' mounted on a substrate 38' formed from either the same, or a different, type of piezoelectric material than the substrate 38. Also, the SAW filter 12b can be fabricated either on the same substrate as that of the SAW filter 12a or on a separate substrate. However, the respective output transducers 37, 37' of the SAW filters 12a, 12b are aligned as indicated by an output transducer center line 70, and a center line 72' of the input transducer 36' is offset from a center line 72 of the input transducer 36 by $(n+\frac{1}{2})\lambda/(m-1)$, with n being equal to an integer greater than or equal to zero, m=2 if feedthrough is the time spur required to be cancelled, and m is an odd number greater than 1 if the $m^{th}$ transit echo is the time spur required to be cancelled. In this case, $\lambda=v/f_0$, where v represents the propagation velocity of the surface acoustic wave on the substrates 38, 38' and $f_0$ represents the center frequency of the SAW filters 12a, 12b. The center lines 70', 72' of the input and output transducers 36', 37' can be adjusted by, for example, adjusting the layout of a mask used to form the input and output transducers 36', 37' during fabrication.

Referring now to FIGS. 6–8C, by spacing the SAW filters 12a, 12b apart from one another in the above-discussed manner, the respective pass band ripples, group delay ripples and the associated time spur associated with the filters 12a, 12b can be made to cancel one another. The time spur can be the me transit echo or feedthrough. For example, as shown by the graph of the SAW filter 12a impulse response h(t) in FIG. 6, a time spur 74 associated with the filter 12a is spaced a distance TD apart from a direct SAW 76 in the time domain. In FIG. 8A, which graphically shows the Fourier Transform of the impulse response h(t), the main signal 76 and the time spur 74 each has an associated frequency response 77 with a center frequency fo, a magnitude response component, or pass band ripple, 78 with magnitude P, an associated phase response derivative, or group delay ripple, 80 with magnitude G, and a period 1/TD=F.

Figure 7:
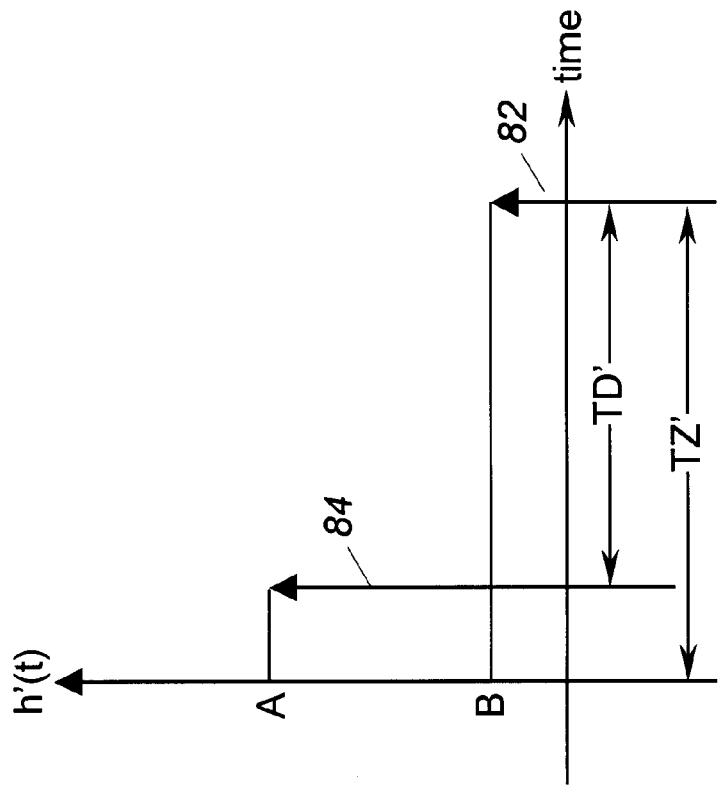

As shown by the graph of the SAW filter 12b impluse response h'(t) in FIG. 7, a time spur 82 that is similar to the time spur 74 associated with the SAW filter 12b is at a spaced distance TD' apart from a main response 84 in the time domain. As shown in FIG. 8B, which graphically shows the Fourier Transform of the function h'(t), the main signal 84 and the time spur 82 each has an associated frequency response 85 with a period 1/TD'=F' that is almost equal to the period F of the frequency response 77, but that has a center frequency fo' that is similar to, but slightly offset from, the center frequency fo of the SAW filter 12a. Therefore, a pass band ripple 86 with magnitude P' and an associated group delay ripple 88 with magnitude G' are offset from the pass band ripple 78 and the group delay ripple 80 associated with the SAW filter 12a by 180°. As a result, and as shown in FIG. 8C, the pass band ripples 78, 86 cancel one another and the group delay ripples 80, 88 cancel one another, leaving only the desired frequency response 90. Even though the time spurs 74 and 82 are on the right hand side of the main signals 76 and 84, respectively, the same cancellation principle will also apply if the time spurs 74 and 82 are on the left side of the main signals 76 and 84, respectively.

Figure 6:
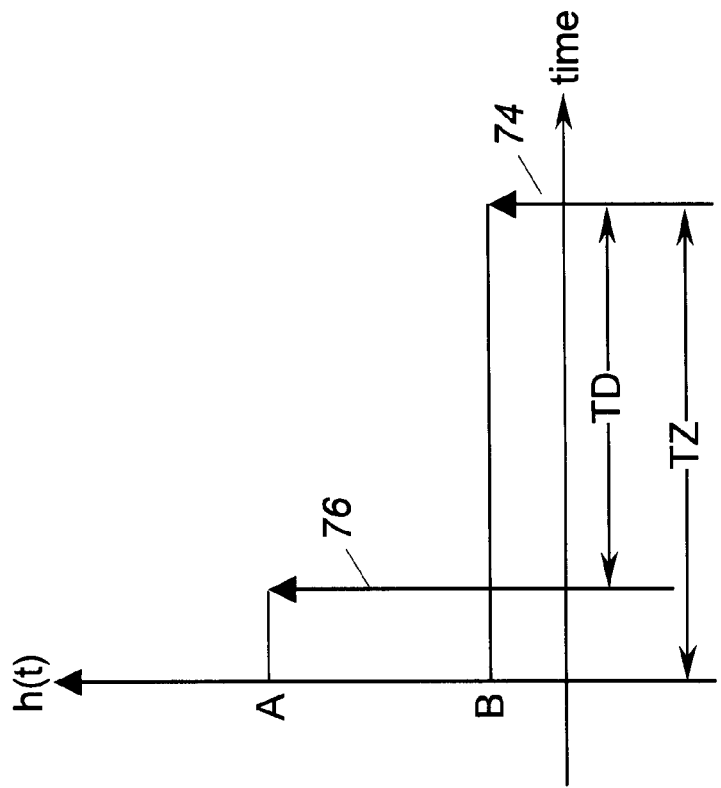

In other words, the pass band ripples 78 and the group delay ripples 80 associated with the impulse response h(t) in FIG. 6 of the SAW filter 12a can be made to cancel the pass band ripples 86, and group delay ripples 88 associated with the impulse response h'(t) in FIG. 7 of the SAW filter 12b by spacing the input transducer 36' of the SAW filter 12b apart from the input transducer 36 of the SAW filter 12a so that the group delay and pass band ripples between the two filters are 180° out of phase and $TD-TD'=(n+\frac{1}{2})/fo$, where n is an integer greater than or equal to zero.

Correspondingly, the triple transit echo of the cascaded response will also be canceled. Referring back to FIGS. 4 and 5, the path length difference between the triple transit echo 66 and the direct surface acoustic wave 52 is 2L. In other words, as shown in FIG. 5, the triple transit echo 66 is T8 away from the main signal where T8=(2L)/v and v is the propagation velocity of the SAW. If the SAW filters 12a, 12b are fabricated in an identical manner but the transducer centers of the SAW filter 12b are separated by a distance L' where $L'=L+(n+\frac{1}{2})\lambda/2$ (where $\lambda=v/fo$), the new: triple transit spur of the SAW filter 12b is T8' away from the main signal and $T8'=(2L')/v=2L+(n+\frac{1}{2})/fo=T8+(n+\frac{1}{2})/fo$. This is exactly the same condition that is described above for spur cancellation.

If the time spur of interest is the $m^{th}$ transit echo where m is an odd integer and is greater than 1, then $L'=L+(n+\frac{1}{2})\lambda/(m-1)$ will also satisfy the condition for the spur cancellation because the $m^{th}$ transit echo is always (m-1)L away from the main signal. Similarly, -if feedthrough is the time spur of interest, then $L'=L+(n+\frac{1}{2})\lambda$ will satisfy the condition for the spur cancellation because the feedthrough is always L away from the main signal. In general, the relationship $L'=L+(n+\frac{1}{2})\lambda/(m-1)$ is true for the time spur cancellation mentioned above. When m=1, the feedthrough Will be cancelled. When m is an odd integer and is greater than 1, the me transit echo will be cancelled. On the other hand, if $L'=L+n\lambda(m-1)$ for m=2, 3, 5 . . . , no spur cancellation occurs for the time spur associated with the particular value of m. This is because the associated time spur of the filter 12a is in phase with the associated time spur of the SAW filter 12b. From the above discussion, it is. clear that if $L'=L+(n+\frac{1}{2})\lambda/(M-1)$, there will be total spur cancellation for the spur associated with the particular value of m=M, and partial cancellation for the spurs associated with the particular value of m<M, and no cancellation for the spurs associated with the particular value of m>M. In other words, if L' and L are designed to suppress feedthrough (m=2), then the mt transit echoes (m>2) will not be cancelled. If L' and L are designed to suppress the fifth transit echo (m=5), then feedthrough and the third transit echo will be partially suppressed, and seventh and higher order transit echoes will not be suppressed.

While the SAW filter system according to the above embodiment of the present invention cancels the group delay and pass band ripples generated by the SAW filters 12a, 12b in the manner described above, other embodiments of the present invention may also be implemented to cancel the group delay and pass band ripples. For example, referring again to FIG. 3A, the center frequency $f_0$ of the SAW filter 12b may be offset from the center frequency $f_0$ of the SAW filter 12a so that the center frequencies of the SAW filters 12a, 12b have the following relationship: $f_0=f_0'+(n+\frac{1}{2})F$, where $F=1/TD$ (see FIGS. 8A–8C).

The center frequency $f_0$, for example, can be changed by changing the geometry of the fingers 36a, 37a of the input and output transducers 36, 37 of the filter 12a. Specifically, the horizontal dimensions or the finger width and finger gap of the fingers 36a, 37a can be changed to change the wavelength of the waves generated by the fingers 36a, 37a. Also, the vertical dimensions, or metal thicknesses, of the fingers 36a, 37a can be changed to change the propagation velocity vf of waves generated by the fingers 36a, 37a. Alternatively, the substrate 38 of the SAW filter 12a can be changed to alter the propagation velocity associated with the SAW filter 12a. Of course, any combination of the above techniques may be used to adjust the center frequency $f_0$, and the above techniques are equally applicable to the SAW filter 12b as well.

According to yet another embodiment of the present invention, a hybrid of the preceding two embodiments may be designed to cancel the group delay and pass band ripples and consequently the associated time spur associated with the SAW filters 12a, 12b. In other words, the SAW filter system 12 may be designed in a manner similar to that of the two above-described embodiments, so that by both spacing of the input transducers 36, 36' by a predetermined fraction of the SAW wavelength, and by offsetting the center frequency $f_0'$ associated with the SAW filter 12a' with respect to the center frequency fo of the SAW filter 12a, cancellation of group delay and pass band ripples and of the associated time spur.

According to yet another embodiment of the present invention, a perturbation regions P1, P2 can be fabricated between the input and output transducers 36, 37 of the SAW filter 12a and between the input and output transducers 36', 37' of the SAW filter 12b, respectively, to cancel the group delay and pass band ripples and consequently the associated time spur associated with the SAW filters 12a, 12b. The perturbation region P1 provides a media for the SAW to travel with a different velocity vp from the free surface velocity v. By changing vp of the perturbation region P1 to vp' of the perturbation region P2, or by changing the physical geometry of the perturbation regions P1 and P2, the TD and TD' of the SAW filters 12a, 12b can be adjusted to satisfy the condition for time spur cancellation as mentioned above.

The above methods are just several techniques for effecting time spur cancellation. According to Eq. (1) below, many combinations of the above methods may be used to cancel time spurs. Using different combinations involves changing one or more parameters in Eq. (1) so that (TD—TD') satisfies the condition $(n+\frac{1}{2})\lambda/(m-1)$ for time spur cancellation. Referring back to FIG. 3A, changing the parameters x1 and or x5 so that x1< >x1' and/or x5< >x5' is equivalent to changing input transducer and/ or output transducer design so that the input transducer 36 is not the same as the input transducer 36' and/or so that the output transducer 37 is not the same as the output transducer 37'. Changing the parameters x2 and or x4 so that x2< >x2' and/or x4< >x4' is equivalent to changing the input and output transducer offset so that L< >L'. Changing x3 and/or vp so that x3< >x3' and/or vp< >vp' is equivalent to changing the perturbation region so that P1 is not the same as P2. Changing vm so that vm< >vm' is equivalent to changing the center frequency of the input transducers 36, 36' and the output transducers 37, 37' so that fo< >fo'. Changing v so that v< >v' is equivalent to using a different material for the SAW filter 12b.

The following provides mathematical derivations for the above conclusions in the most general form.

Let T (T is used to distinguish TD since TD is the separation between the main signal and time spur). be the time delay for a main SAW signal to travel from L1 to L2 for the SAW filter 12a, and let T' be the time delay for the main SAW signal to travel from L1' to L2' for the SAW filter 12b. Further, $T=(x1+x5)/vm+(x2+x4)/v+x3/vp$ for the SAW filter 12a. Also, $T'=(x1'+x5')/vm'+(x2'+x4')/v'+x3'/vp'$ for the SAW filter 12b, where vm is the SAW propagation velocity in the transducers of the SAW filter 12a, vm' is the SAW propagation velocity in the transducers of the SAW filter 12b, v is the SAW propagation velocity in the free surface of filter 12a, v' is the SAW propagation velocity in the free surface of the SAW filter 12b, vp is the SAW propagation velocity in the perturbation region P1 of the SAW filter 12a, and vp' is the SAW propagation velocity in the perturbation region P2 of the SAW filter 12b.

$$T-T'=[(x1+x5)/vm-(x1'+x5')/vm']+[(x2+x4)/v-(x2'+x4')/v']+(x3/vp-x3'/vp') \quad \text{Eq. (1)}$$

Conditions for time spur cancellation using transducer offset method are as follows.

If the input transducers 36, 36' are identical, and the output transducers 37, 37' are identical, the perturbation region P1 is the same as the perturbation region P2, and both the SAW filters 12a, 12b are built on the same type of substrate material, then x1=xl', x5=x5', x3=x3', vm=vm', v=v', and vp=vp', Eq. (1) therefore becomes:

$$T-T'=[(x2+x4)-(x2'+x4')]/v \quad \text{Eq. (2)}$$

T–T' in Eq. (2) is a function of the spacing between the input and output transducers 36, 37 and 36', 37', and it is independent of the perturbation regions as long as the perturbation region P1 is identical to the perturbation region P2. Hence Eq. (2) can also be written as:

$$T-T'=(L-L')/v \quad \text{Eq. (3)}$$

In order to cancel the feedthrough spur, the below condition must be satisfied:

$$(T-T')=(n+\frac{1}{2})/f_0=(L-L')/v \quad \text{Eq. (4)}$$

Further, in order to cancel the $m^{th}$ transit spur, the below condition must be satisfied:

$$(T-T')=(n+\frac{1}{2})/f_0(m-1)=(L-L')/v \quad \text{Eq. (5)}$$

Conditions for time spur cancellation using the transducer frequency offset method are as follows.

If the input transducers 36, 36' are identical, the output transducers 37, 37' are identical, the perturbation region P1 is same as the perturbation region P2, x2=x2', x4=x4' but vm< >vm', x1< >x1', and x5< >x5', x3=x3' and vp=vp', Eq. (1) becomes $$T-T'=[(x1+x5)/vm-(x1'+x5')/vm'] \quad \text{Eq. (6)}$$

In order to cancel the feedthrough spur, Eq. (6)=Eq. (4).
In order to cancel the $m^{th}$ transit spur, Eq. (6)=Eq. (5).
One special case for Eq. (6)=Eq. (4) or Eq. (6)=Eq. (5) is fo–fo'=$(n+\frac{1}{2})$/TD as demonstrated in FIGS. 8A–8C.

Conditions for time spur cancellation using perturbation region method are as follows.

For purposes of discussion, assume that the input transducers 36, 36' are identical, the output transducers 37, 37' are identical, both SAW filters 12a, 12b are built on the same type of substrate, and L is the same for both SAW filters 12a, 12b. Eq. (1) then becomes:

$$T-T'=[(x2+x4)-(x2'+x4')]/v+(x3/vp-x3'/vp') \quad \text{Eq. (7)}$$

In order to cancel the feed through spur, Eq. (7)=Eq. (4).
In order to cancel the m$^{th}$ transit spur, Eq. (7)=Eq. (5).
Eq. 7 shows that (T−T') is a function of x2, x3, x4 and vp of the SAW filter 12a, and x2', x3', x4' and vp' of the SAW filter 12b.

It is obvious from Eq. (7) that if x3 and/or vp of the SAW filter 12a is different from x3' and/or vp' of the SAW filter 12b, the conditions Eq. (7)=Eq. (4) or Eq. (7)=Eq. (5) can be satisfied.

It should be noted that if x3 and x3' are set to different values easily by changing the width of the perturbation regions P1 and P2, then subsequently, x2, x4 and x2', x4' will be different.

Also, vp and vp' can be set to different values by changing the physical geometry of the perturbation regions P1 and P2 as shown in FIG. 2.

FIGS. 3B–3F are cross-section views of perturbation regions P1 and P2 along the lines III–III and III'–III' in FIG. 2, respectively. They show different ways of implementing the perturbation regions P1, P2. FIGS. 3B, 3D and 3F show that vp can be changed by changing the corresponding vertical dimensions indicated in each figure. FIGS. 3C, 3E and 3G show that the perturbation region P1 can be subdivided into more than one section, with each subsection being either periodic or a periodic with respect to the other subsections.

Figure 9:
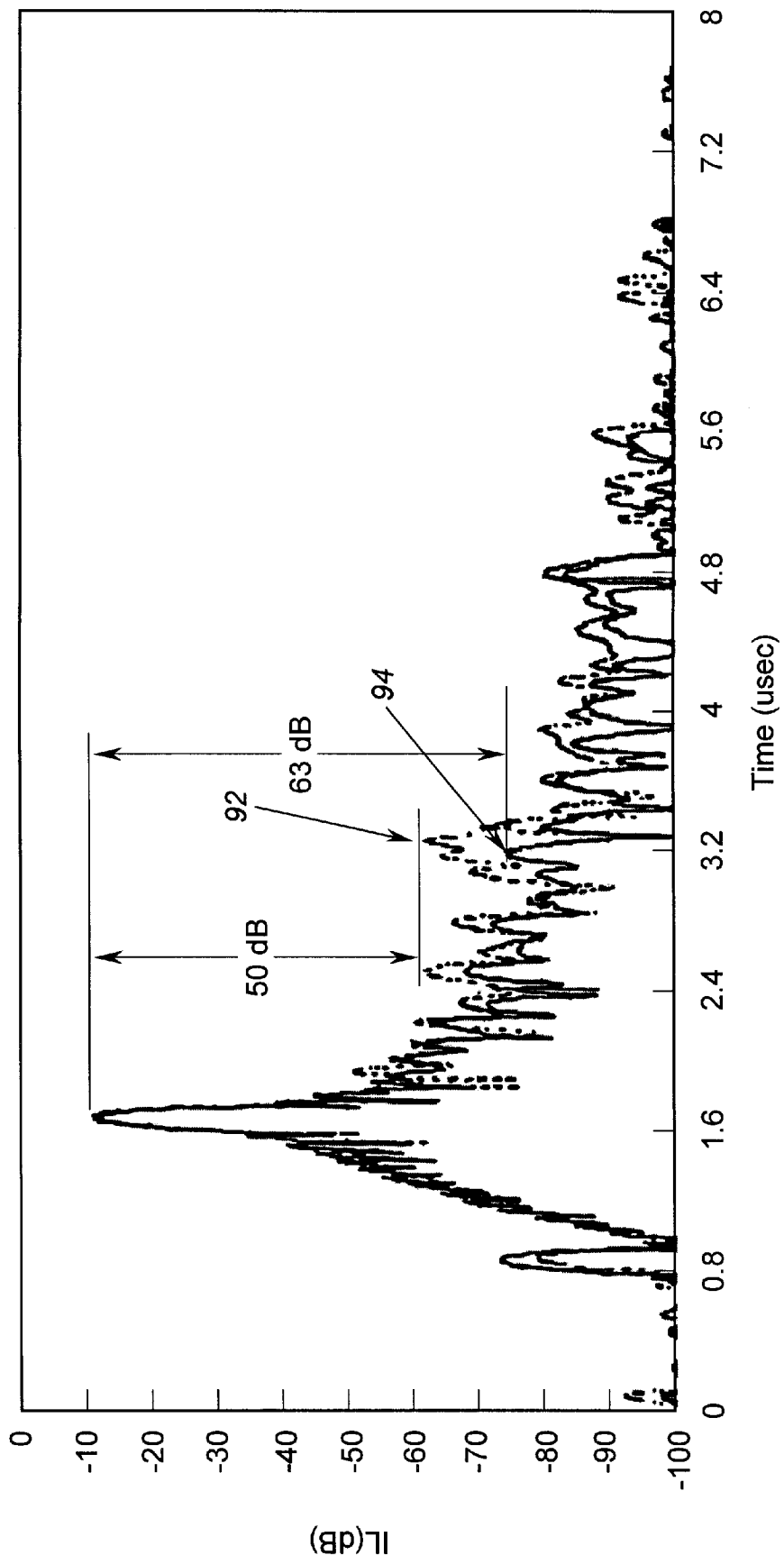
FIG. 9 is a graph illustrating the effects of the time domain response of the cascaded SAW filter system of FIG. 3A on triple transit suppression.

FIG. 9 shows the benefits of implementing the SAW filter system according to the above embodiments of the present invention. Specifically, the filter output resulting from two identical filters being cascaded according to a conventional technique are shown at, 92, while the filter output of the SAW filter system of the present invention is shown at 94. As shown, triple transit suppression was only 50 dB using the conventional cascading technique, while triple transit suppression was increased to 63 dB by using the SAW filter system of the present invention.

Figure 10:
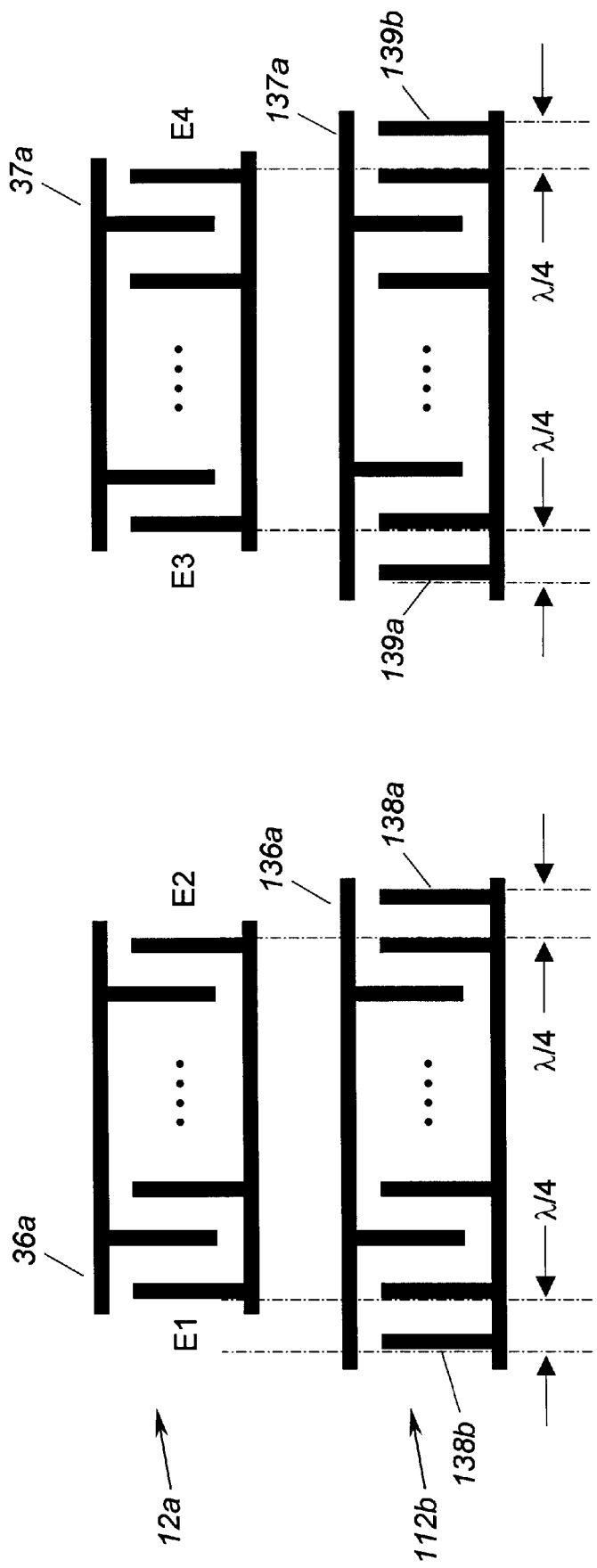
FIG. 10 is a plan view of the first filter and the second filter of a cascaded SAW filter system according to another preferred embodiment of the present invention.

FIG. 10 shows another embodiment of the present invention that is particularly useful when implemented in a SAW filter built on a substrate formed from strong coupling material such as lithium niobate. Specifically, input and output transducers 136a, 137a of a SAW filter 112b are shown with the input and output transducers 36a, 37a of the SAW filter 12a. The input and output transducers 136a, 137a include dummy fingers 138a, 139a at each respective end thereof. Referring back to the related art shown in FIG. 4, the path length difference between regenerated wave 54 and the direct surface acoustic wave 52 is 2X. In other words, the regenerated wave or spur 54 is T2 away from the main wave where T2=(2X)/vm. Similarly, the path length difference between the regenerated wave or spur 56 and the direct surface acoustic wave 52 is 2Y. In other words, the spur 56 is T3 away from the direct surface acoustic wave 52 where T3=(2Y)/vm. If the SAW filter 112b is designed to have the same input transducer and output transducer as the SAW filter 12a with the exception that the dummy finger 138a is added at λ/4 (λ=fo/vm)to the right side of the input transducer 136a, and the dummy finger 139a is added at λ/4 to the left side of the output transducer 137a, the new path length difference between the reflection of the regenerated wave 54 and the direct surface acoustic wave 52 and between the reflection of the regenerated wave 56 and the direct surface acoustic wave 52 for the SAW filter 112b will be 2X' and 2Y' respectively. The X, X' and Y, Y' are related to each other as X'=X+λ/4 and Y'=Y+λ/4, respectively. T2' and T3' for the SAW filter 112b are related to T2 and T3 of the SAW filter 12a as T2'=(2X')/v=T2+1/(2fo) and T3'=(2Y')/v=T3+1/(2fo). Both satisfy the condition described above for spur cancellation.

Similarly, a dummy finger 138b can be added to the left end of the input transducer 136a, and the dummy finger 139b can be added to the right side of the output transducer 137a in the same manner as described above for edge reflection cancellation. In addition, if the transducer sampling rate is four fingers per λ, then (2n+1) dummy fingers spaced λ/4 apart from each other can be added to the respective ends of the filter 112b for edge reflection cancellation. If the sampling rate is not equal to four fingers per λ, the edge reflection cancellations can also be achieved by adding a number of dummy fingers at the ends of the input and output transducers 136, 137 of the filter 112b so that the offset of the edges of the transducers between the filters 12a, 112b is approximately (n+½) λ/2.

Upon reading of the foregoing description, one skilled in the art will realize that the SAW filter system according to the preferred embodiments of the present invention is advantageous over conventional SAW filters for several reasons. Specifically, the SAW filter system of the present invention is extremely simple to implement. For example, triple transit suppression can be easily achieved by offsetting the input and output transducers of the two filters by λ/4, or by offsetting the center frequencies:of the filters by 1/(2TD), where TD is the separation between the main signal and triple transit echo. Similar suppression can also be done to feedthrough spur or higher order transit echoes by using the similar offset approach, depending on which spur is the dominant one that degrades the overall performance. If. this approach is used properly, one spur can be totally cancelled while one or more other spurs can be partially suppressed. The dummy finger approach and the offset approach can be incorporated into the SAW filter system to cancel both the edge reflections and the other time spurs mentioned above.

Further, the SAW filter system eliminates the intrinsic problem associated with cascading two identical filters; that is, the group delay and pass band ripples almost double and associated time spur suppression is 6 dB worse after cascading two identical filters. Since the group delay and pass band ripple responses of the first filter are always 180° out of phase with respect to those of the second filter, the cascaded ripples are less than the ripples of the individual response due to the above-discussed ripple cancellation associated with the present invention. In other words, the SAW filter system of the present invention further suppresses the cascaded time spur when compared to conventional suppression techniques without needing to be overdesigned to reduce the group delay and pass band ripples.

In addition, if two perfectly matched SAW filters are used in the SAW filter system of the present invention, group delay and pass band ripples can theoretically go to 0 and the associated time spur can theoretically be eliminated. This represents a significant advantage over conventional techniques in which cascading two filters typically results in twice the ripples and 6 dB degradation in the associated time spur.

Also, the SAW filter system of the present invention is less sensitive to matching circuit component variations due to temperature change or component tolerances, thereby resulting in a more consistent cancellation of the group delay and pass band ripples and the triple transit spur. The SAW filter system of the present invention can also be implemented with less costly filters, as there is no need to fine tune the filter responses in order to meet the tight ripple or triple transit spur requirements as in conventional SAW filter implementations. Further, because the SAW filter system of the present invention can tolerate a higher triple transit spur associated with individual filters used in the system, the insertion loss of the filter system can be improved.

It should also be appreciated that the SAW filter system of the present invention can be implemented using filters with a wide range of fractional bandwidth. In general, the SAW filter system of the present invention works best when filters having narrow fractional bandwidth are used. However, experimental data has shown that the SAW filter system of the present invention implemented with filters having 23% fractional bandwidth still is capable of canceling group delay and pass band ripples.

Further, the SAW filter system of the present invention also provides a simple solution regarding cancellation of transducer edge reflections that become problematic for filter systems implemented on substrates composed of strong coupling materials by adding dummy fingers to input and output transducer ends.

In addition, the SAW filter system of the present invention may be implemented using any type of transversal SAW filter pair in cascade. Specifically, SPUDT filters may preferably be used to implement the present invention because the triple transit echo associated with an individual SPUDT filter is initially small.

Finally, it should be noted that, because the input and output transducer separations are different for the individual SAW filters in the SAW filter system of the present invention, the separations in time between the feedthrough spur and the main wave are also different for the individual filters. If the offset approach is mainly used to cancel the triple transit echo, the cascaded feedthrough suppression will not be degraded by 6 dB as with two identical cascaded filters because feedthrough spurs of the cascaded offset filters have partial offset.

While the above description is of the preferred embodiment of the present invention, it should be appreciated that the invention may be modified, altered, or varied without deviating from the scope and fair meaning of the following claims.

What is claimed is:

1. A surface acoustic wave filter system comprising:
   a first filter including a first piezoelectric substrate, a first input transducer on the first piezoelectric substrate for generating and transmitting a first surface acoustic wave having a predetermined wavelength $\lambda$ from an input electrical signal having a predetermined frequency, and a first output transducer for receiving and converting the first surface acoustic wave to a first filtered electrical signal;
   a second filter cascaded in series with the first filter and including a second piezoelectric substrate, a second input transducer for generating and transmitting a second surface acoustic wave from the first filtered electrical signal, and a second output transducer for receiving and converting the second surface acoustic wave to a second filtered electrical signal;
   wherein the first input transducer of the first filter is separated from the second input transducer of the second filter by a distance of $(n+\frac{1}{2})\lambda(m-1)$, where n is an integer greater than or equal to 0, and m is either 2 if the time spur is feedthrough or an odd integer greater than 1 if the time spur is the $m^{th}$ transit echo, to enhance system time spur suppression.

2. The surface acoustic wave filter system of claim 1, wherein the first input transducer of the first filter is separated from the second input transducer of the second filter to enhance the system time spur suppression by more than 20 dB.

3. The surface acoustic wave filter system of claim 1, wherein the first input transducer of the first filter is separated from the second input transducer of the second filter to inhibit group delay ripples and pass band ripples.

4. The surface acoustic wave filter system of claim 1, wherein the first and second piezoelectric substrates comprise first and second high coupling piezoelectric material substrates.

5. The surface acoustic wave filter system of claim 1, further comprising at least one dummy finger at at least one end of each of the first input and output transducers and the second input and output transducers for inhibiting edge reflections.

6. The surface acoustic wave filter system of claim 5, wherein the at least one dummy finger comprises (2n+1) dummy fingers spaced $\lambda/4$ apart from each other at respective ends of the first and second input and output transducers when a transducer sampling rate is four fingers per $\lambda$.

7. The surface acoustic wave filter system of claim 1, wherein the first and second piezoelectric substrates are formed from an identical piezoelectric material.

8. The surface acoustic wave filter system of claim 1, wherein the first and second piezoelectric substrates are formed from different piezoelectric materials.

9. The surface acoustic wave filter system of claim 1, wherein the first input transducer of the first filter is separated from the second input transducer of the second filter to further provide a system insertion loss that is less than an insertion loss associated with a surface acoustic wave filter system comprising two identical filters in cascade.

10. The surface acoustic wave filter system of claim 1, further comprising:
    an input matching circuit in electrical communication with the first input transducer of the first filter and an output matching circuit in electrical communication with the second output transducer of the second filter, wherein each of the input and output matching circuits comprises one or more RLC components for matching respective impedances of the first and second filters to a surrounding system impedance.

11. The surface acoustic wave filter system of claim 1, wherein each of the first and second filters comprises a SPUDT surface acoustic wave filter.

12. A surface acoustic wave filter system comprising:
    a first filter including a first piezoelectric substrate, a first input transducer on the first piezoelectric substrate for generating and transmitting a first surface acoustic wave having a predetermined wavelength $\lambda$ from an input electrical signal having a predetermined frequency, and a first output transducer for receiving and converting the surface acoustic wave to a first filtered electrical signal;
    a second filter cascaded in series with the first filter and including a second piezoelectric substrate, a second input transducer for generating and transmitting a second surface acoustic wave from the first filtered electrical signal, and a second output transducer for receiving and converting the second surface acoustic wave to a second filtered electrical signal;
    wherein a center frequency $f_0'$ of the second filter is offset from a center frequency $f_0$ of the first filter as follows: $f_0 = f_0' + (n+\frac{1}{2})F$, where n is an integer greater than or equal to 0, and F is the predetermined frequency of the input electrical signal and the filtered electrical signal, to enhance system time spur suppression.

13. The surface acoustic wave filter system of claim 12, wherein the center frequency $f_0'$ of the second filter is offset from a center frequency $f_0$ of the first filter to enhance system triple transit suppression.

14. The surface acoustic wave filter system of claim 12, wherein the center frequency $f_0'$ of the second filter is offset from the center frequency $f_0$ of the first filter to enhance $m^{th}$ transit suppression of the cascaded filter system when m is an odd integer greater than 1, and to enhance system feedthrough suppression.

15. The surface acoustic wave filter system of claim 12, wherein the center frequency $f_0'$ of the second filter is offset from the center frequency $f_0$ of the first filter to inhibit group delay ripples and pass band ripples.

16. The surface acoustic wave filter system of claim 12, wherein the first and second piezoelectric substrates comprise first and second high coupling piezoelectric material substrates.

17. The surface acoustic wave filter system of claim 14, further comprising at least one dummy finger at at least one end of each of the first input and output transducers and the second input and output transducers for inhibiting edge reflections.

18. The surface acoustic wave filter system of claim 17, wherein the at least one dummy finger comprises (2n+1) dummy fingers spaced $\lambda/4$ apart from each other at respective ends of the first and second input and output transducers when a transducer sampling rate is four fingers per $\lambda$.

19. The surface acoustic wave filter system of claim 12, wherein the first and second piezoelectric substrates are formed from an identical piezoelectric material.

20. The surface acoustic wave filter system of claim 12, wherein the first and second piezoelectric substrates are formed from different piezoelectric materials.

21. The surface acoustic wave filter system of claim 12, further comprising a buffer between the first and second filters for electrically isolating the first and second filters from one another and for preventing distortion of the first filtered electrical signal.

22. The surface acoustic wave filter system of claim 12, wherein the center frequency $f_0'$ of the second filter is offset from the center frequency $f_0$ of the first filter to further provide a system insertion loss that is less than an insertion loss associated with a surface acoustic wave filter system comprising two identical filters in cascade.

23. The surface acoustic wave filter system of claim 12, further comprising: an input matching circuit in electrical communication with the first input transducer of the first filter and an output matching circuit in electrical communication with the second output transducer of the second filter, wherein each of the input and output matching circuits comprises of one or more RLC components for matching respective impedances of the first and second filters to a surrounding system impedance.

24. The surface acoustic wave filter system of claim 12, wherein each of the first and second filters comprises a SPUDT surface acoustic wave filter.

25. A surface acoustic wave filter system comprising:
a first filter including a first piezoelectric substrate, a first input transducer on the first piezoelectric substrate for enerating and transmitting a first surface acoustic wave having a predetermined wavelength $\lambda$ from an input electrical signal having a predetermined frequency, and a first output transducer for receiving and converting the surface acoustic wave to a first filtered electrical signal;
a second filter cascaded in series with the first filter and including a second piezoelectric substrate, a second input transducer for generating and transmitting a second surface acoustic wave from the first filtered electrical signal, and a second output transducer for receiving and converting the second surface acoustic wave to a second filtered electrical signal;
wherein a center frequency $f_0'$ of the second filter is offset from a center frequency $f_0$ of the first filter by a predetermined amount, and the first input transducer of the first filter is separated from the second input transducer of the second filter by a predetermined distance, so that group delay and pass band ripples are 180° out of phase with one another and a temporal location TD of a time spur, such as an $m^{th}$ transit echo or feedthrough, where m is an odd integer greater than 1 for the $m^{th}$ transit, from the surface acoustic wave main response of the first filter versus a temporal location TD' of a time spur, such as a $m^{th}$ transit echo or feedthrough, from the surface acoustic wave main response of the second filter so that $TD=TD'+(n+\frac{1}{2})/f_0$, where n is an integer greater than or equal to zero.

26. A surface acoustic wave filter system comprising:
a first filter including a first piezoelectric substrate, a first input transducer on the first piezoelectric substrate for generating and transmitting a first surface acoustic wave having a predetermined wavelength $\lambda$ from an input electrical signal having a predetermined frequency, and a first output transducer for receiving and converting the first surface acoustic wave to a first filtered electrical signal;
a first perturbation region located between the first input transducer and the first output transducer and through which the first surface acoustic wave propagates;
a second filter cascaded in series with the first filter and including a second piezoelectric substrate, a second input transducer for generating and transmitting a second surface acoustic wave from the first filtered electrical signal, and a second output transducer for receiving and converting the second surface acoustic wave to a second filtered electrical signal;
a second perturbation region located between the second input transducer and the second output transducer and through which the second surface acoustic wave propagates;
wherein respective physical geometries of the first and second perturbation regions differ from one another so that a difference in propagation delays from the input transducer to the output transducer between the first and second filters is $(n+\frac{1}{2})/[f_0(m-1)]$, where n is an integer greater than or equal to 0, and m is 2 for feedthrough suppression or is an odd integer greater than 1 for $m^{th}$ transit echo suppression, to enhance system time spur suppression.

27. A surface acoustic wave filter system comprising:
a first filter including a first piezoelectric substrate, a first input transducer on the first piezoelectric substrate for generating and transmitting a first surface acoustic wave having a predetermined wavelength $\lambda$ from an input electrical signal having a predetermined frequency, and a first output transducer for receiving and converting the first surface acoustic wave to a first filtered electrical signal;
a first perturbation region located between the first input transducer and the first output transducer and through which the first surface acoustic wave propagates;

a second filter cascaded in series with the first filter and including a second piezoelectric substrate, a second input transducer for generating and transmitting a second surface acoustic wave from the first filtered electrical signal, and a second output transducer for receiving and converting the second surface acoustic wave to a second filtered electrical signal;

a second perturbation region located between the second input transducer and the second output transducer and through which the second surface acoustic wave propagates;

wherein at least one of the following conditions is satisfied to enhance time spur suppression in the first and, second filtered electrical signals: the first input transducer of the first filter is separated from the second input transducer of the second filter by a predetermined distance, a center frequency $f_0'$ of the second filter is offset from a center frequency $f_0$ of the first filter by a predetermined amount, and respective physical geometries of the first and second perturbation regions differ from one another.

* * * * *

UNITED STATES PATENT AND TRADEMARK OFFICE
CERTIFICATE OF CORRECTION

PATENT NO. : 6,664,871 B2
DATED : December 16, 2003
INVENTOR(S) : David S. Yip

It is certified that error appears in the above-identified patent and that said Letters Patent is hereby corrected as shown below:

Column 13,
Line 43, should read:
--    1. A surface acoustic wave filter system comprising:
A first including a first piezoelectric substrate, a first input transducer on first piezoelectric substrate for generating and transmitting a first surface acoustic wave having a predetermined wavelength $\lambda$ from an input electrical signal having a predetermined frequency, and a first output transducer for receiving and converting the first surface acoustic wave to a first filtered electrical signal;
a second filter cascaded in series with the first filter and including a second piezoelectric substrate, a second input transducer for generating an transmitting a second surface acoustic wave from the first filtered electrical signal, and a second output transducer for receiving and converting the second surface acoustic wave to a second filtered electrical signal;

wherein the first input transducer of the first filter is separated from the second input transducer of the second filter by a distance of $(n + ½)\lambda/(m-1)$, where n is an integer greater than or equal to 0, and m is either 2 if the time spur is feedthrough or an odd integer greater than 1 if the time spur is the $m^{th}$ transit echo, to enchance system time spur suppression. --

Signed and Sealed this

Third Day of May, 2005

JON W. DUDAS
*Director of the United States Patent and Trademark Office*